(12) United States Patent
Kang

(10) Patent No.: US 7,129,571 B2
(45) Date of Patent: Oct. 31, 2006

(54) SEMICONDUCTOR CHIP PACKAGE HAVING DECOUPLING CAPACITOR AND MANUFACTURING METHOD THEREOF

(75) Inventor: Sun-Won Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/977,533

(22) Filed: Oct. 28, 2004

(65) Prior Publication Data

US 2005/0104209 A1 May 19, 2005

(30) Foreign Application Priority Data

Nov. 18, 2003 (KR) ...................... 10-2003-0081531

(51) Int. Cl.
*H01L 23/02* (2006.01)
(52) U.S. Cl. ...................... 257/678; 257/728; 257/691; 257/698; 257/707; 257/710; 257/700; 257/E23.001; 257/E23.051; 257/E23.069; 257/E23.114; 257/E23.144; 257/737; 257/924; 361/763
(58) Field of Classification Search ................ 257/678, 257/691, 698, 707, 710, 728, 700, 737, 924, 257/E23.153, E23.057, E23.144; 361/763
See application file for complete search history.

(56) References Cited

U.S. PATENT DOCUMENTS

| | | | | |
|---|---|---|---|---|
| 5,796,170 A | * | 8/1998 | Marcantonio | ................ 257/786 |
| 5,977,640 A | * | 11/1999 | Bertin et al. | ................. 257/777 |
| 6,020,637 A | * | 2/2000 | Karnezos | ..................... 257/738 |
| 6,118,178 A | * | 9/2000 | Takeuchi | ..................... 257/707 |
| 6,222,246 B1 | * | 4/2001 | Mak et al. | ................... 257/532 |
| 6,307,255 B1 | | 10/2001 | Stave | |
| 6,407,929 B1 | * | 6/2002 | Hale et al. | ................... 361/763 |
| 6,445,594 B1 | * | 9/2002 | Nakagawa et al. | ......... 361/776 |
| 6,538,313 B1 | * | 3/2003 | Smith | ......................... 257/684 |
| 6,717,248 B1 | * | 4/2004 | Shin et al. | ................... 257/678 |
| 6,833,614 B1 | * | 12/2004 | Higuchi | ....................... 257/691 |
| 6,936,922 B1 | * | 8/2005 | Park et al. | ................... 257/737 |

FOREIGN PATENT DOCUMENTS

| | | |
|---|---|---|
| JP | 05-166876 | 7/1993 |
| JP | 05-291347 | 11/1993 |

OTHER PUBLICATIONS

English language abstract of the Japanese Publication No. 05-166876.
English language abstract of the Japanese Publication No. 05-291347.

* cited by examiner

*Primary Examiner*—Minhloan Tran
*Assistant Examiner*—Eduardo A. Rodela
(74) *Attorney, Agent, or Firm*—Marger Johnson & McCollom, P.C.

(57) ABSTRACT

A semiconductor chip package has a substrate that includes circuit lines provided on first and/or second surfaces, a power plane provided on the second surface, bump lands provided on the second surface and coupled to the circuit lines, and ball lands provided on the first surface. The package further has a semiconductor chip attached to the second surface of the substrate and electrically coupled to the circuit lines, and a dielectric layer provided on the second surface of the substrate. The dielectric layer surrounds laterally the chip, covers the power plane, and exposes the bump lands. The package further has a ground plane provided on both the chip and the dielectric layer, vertical connection bumps provided within the dielectric layer and on the bump lands and electrically coupled to the ground plane, and solder balls provided on the ball lands.

20 Claims, 13 Drawing Sheets

SEMICONDUCTOR CHIP PACKAGE HAVING DECOUPLING CAPACITOR AND MANUFACTURING METHOD THEREOF

CROSS REFERENCE TO RELATED APPLICATIONS

This application claims priority under 35 U.S.C. §119 to Korean Patent Application No. 2003-81531, filed Nov. 18, 2003, the contents of which are incorporated herein in its entirety by reference.

BACKGROUND OF THE INVENTION

1. Field of the Invention

The present invention relates generally to electronic packaging technology and, more particularly, to a semiconductor chip package having an improved decoupling capacitor and a method for manufacturing the semiconductor chip package.

2. Description of the Related Art

Along with the fast clock speed of semiconductor devices, noises and signal propagation delay are becoming important issues that must be addressed. Power/ground noises may be caused by parasitic inductance in high-speed semiconductor devices and/or a package substrate. The power/ground noise leads to increasing signal delay that may result in performance degradation.

The employment of decoupling capacitors is a common approach to reduce the power/ground noise. When the decoupling capacitor is used in a semiconductor chip package, an ideal decoupling capacitor should have only capacitance without resistance and inductance. An actual package, however, has internal resistance and inductance within the decoupling capacitor and conductive paths between the device and the decoupling capacitor. This may diminish the beneficial effects of the decoupling capacitors. Further, the capacitance of the decoupling capacitor should be determined in consideration of signal characteristics, maximum acceptable noise, and parasitic inductance. This may raise difficulty in choosing the decoupling capacitors.

SUMMARY OF THE INVENTION

Exemplary, non-limiting embodiments of the present invention may provide a semiconductor chip package having an improved decoupling capacitor, which has a shorter path to a semiconductor device, reduced parasitic resistance and inductance, and easy capacitance adjustability.

According to an exemplary embodiment of the present invention, a semiconductor chip package comprises a substrate that includes a first surface, a second surface, circuit lines provided on at least one of the first and second surfaces, a power plane provided on the second surface, at least one bump land provided on the second surface and coupled to the circuit lines, and a plurality of ball lands provided on the first surface. The package further comprises a semiconductor chip attached to the second surface of the substrate and electrically coupled to the circuit lines, and a dielectric layer provided on the second surface of the substrate. The dielectric layer surrounds laterally the chip, covers the power plane, and exposes the bump land. The package further has a ground plane provided on both the chip and the dielectric layer, at least one vertical connection bump provided within the dielectric layer and on the bump land and electrically coupled to the ground plane, and a plurality of solder balls provided on the ball lands.

According to another exemplary embodiment of the present invention, a method for manufacturing a semiconductor chip package comprises providing a substrate that includes a first surface, a second surface, circuit lines provided on at least one of the first and second surfaces, a power plane provided on the second surface, at least one bump land provided on the second surface and coupled to the circuit lines, and a plurality of ball lands provided on the first surface. The method further comprises providing a semiconductor chip on the second surface of the substrate such that the chip is attached to the second surface and electrically coupled to the circuit lines. The method further comprises providing a dielectric layer on the second surface of the substrate so as to surround laterally the chip, to cover the power plane, and to expose the bump land, providing at least one vertical connection bump within the dielectric layer and on the bump land, providing a ground plane on both the chip and the dielectric layer such that the ground plane is electrically coupled to the vertical connection bump, and providing a plurality of solder balls on the ball lands.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In the description, well-known structures and processes have not been described or illustrated in detail to avoid obscuring the present invention. It will be appreciated that the figures are not drawn to scale. Rather, for simplicity and clarity of illustration, the dimensions of some of the elements are exaggerated relative to other elements. Like numerals are used for like and corresponding parts of the various drawings.

First Exemplary Embodiment

Figure 1:
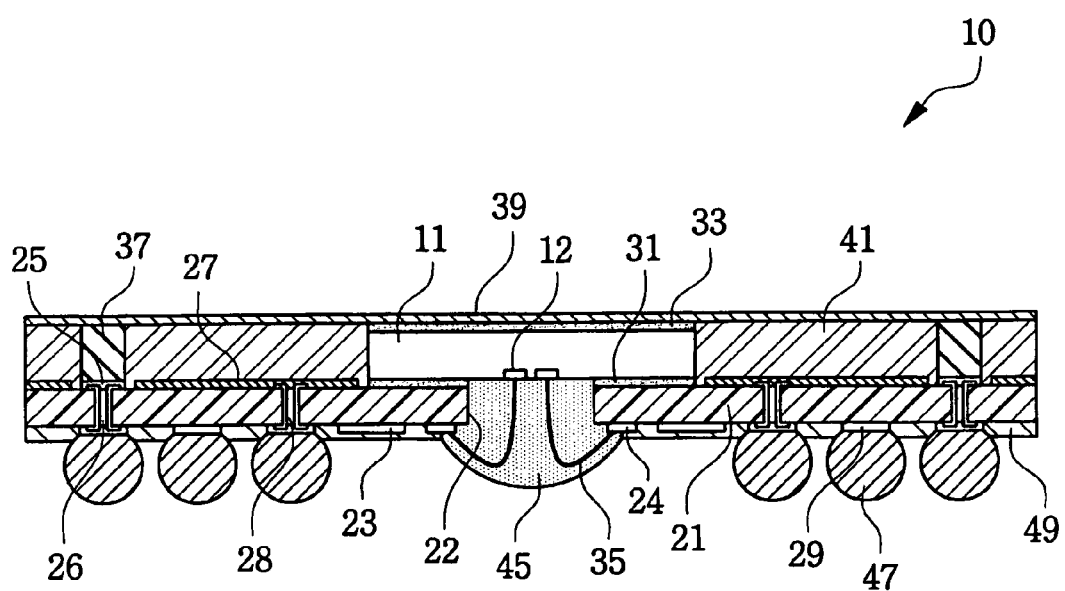
FIG. 1 is a cross-sectional view of a semiconductor chip package in accordance with a first exemplary embodiment of the present invention.
Figure 2:
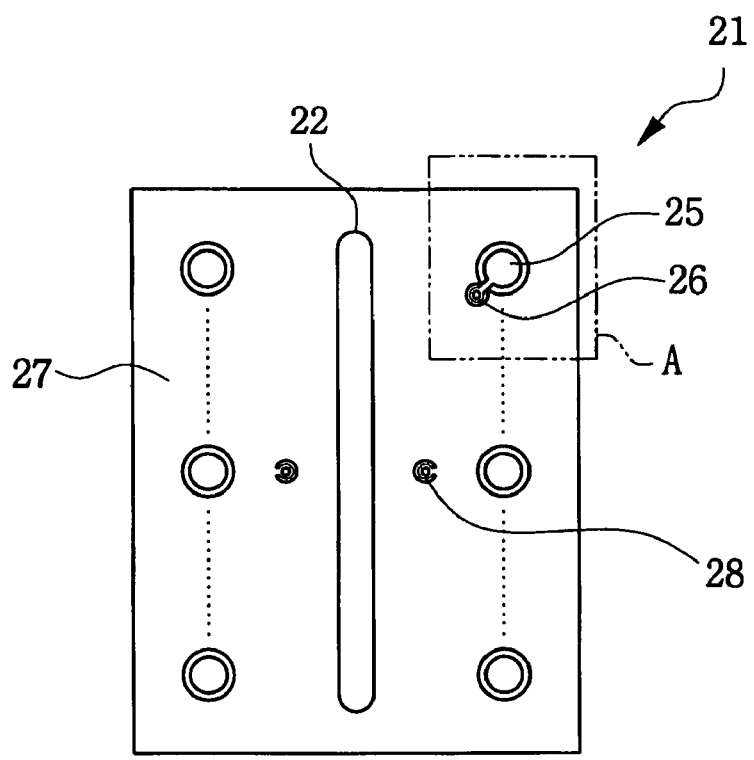
FIG. 2 is a plan view of a substrate exemplarily used in the semiconductor chip package of the first exemplary embodiment of the present invention.
Figure 3:
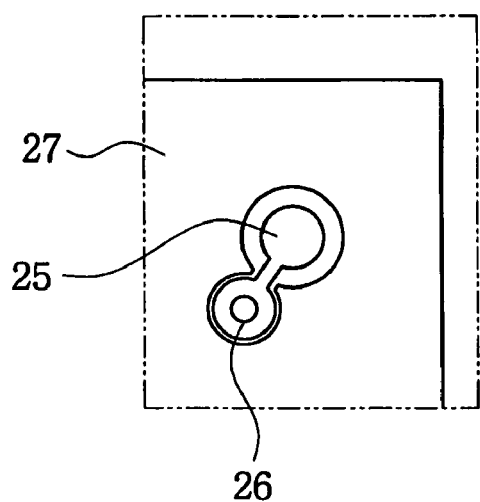
FIG. 3 is an enlarged view of section "A" in FIG. 2.

FIG. 1 illustrates, in a cross-sectional view, a semiconductor chip package 10 in accordance with a first exemplary embodiment of the present invention. Further, FIG. 2 illustrates a plan view of a substrate 21 as used in the semiconductor chip package 10 shown in FIG. 1; and FIG. 3 shows an enlarged view of section "A" in FIG. 2.

Package 10 includes a semiconductor chip 11 of a center pad type. That is, chip pads 12 are formed along a central line on an active surface of chip 11. The active surface of the chip 11 faces a substrate 21 and is attached thereto. The chip pads 12 of chip 11 are electrically coupled to the substrate 21 through bonding wires 35. Solder balls 47 are formed on the substrate 21 and are used as external connection terminals of the package 10. In particular, the package 10 has a decoupling capacitor composed of a power plane 27, a ground plane 39, and a dielectric layer 41.

The substrate 21 in this embodiment has an opening 22 formed in a central region of the substrate 21. When the chip 11 is attached to the substrate 21, the chip pads 12 are exposed through the opening 22 for wire bonding. The substrate 21 may be a printed circuit board, a flexible circuit tape, or other kinds of substrates, as are well known in this art.

On the bottom surface of the substrate 21 are formed substrate pads 24, ball lands 29, and circuit lines 23. The substrate pads 24 preferably are disposed near the edges of the opening 22, and the ball lands 29 are spaced apart from the substrate pads 24 and arranged in a grid array. Circuit lines 23 connect the substrate pads 24 and the ball lands 29.

On the top surface of the substrate 21 are formed a power plane 27 and the bump lands 25. The power plane 27, made of a metal layer, generally covers most of the top surface of the substrate 21, as best shown in FIG. 2. Bump lands 25 are disposed like islands and separated from the power plane 27 (FIG. 2). The power plane 27 may cover only specific parts of the top surface of the substrate 21. Bump lands 25 are coupled to ground lines of the circuit lines 23 through internal vias 26 in the substrate 21. Similarly, the power plane 27 is coupled to power lines of circuit lines 23 through internal vias 28 in the substrate 21. Internal vias 26 for the bump lands 25 may be located underneath the bump lands 25, as shown in FIG. 1, or near the bump lands 25, as shown in FIG. 3.

The chip 11 is attached to the top surface of the substrate 21 through an adhesive layer 31 such that the chip pads 12 are located within the opening 22. For electrical connection between the chip 11 and the substrate 21, each bonding wire 35 connects to a chip pad 12 at one end and to a substrate pad 24 at the other end through the opening 22.

The dielectric layer 41 is provided on the top surface of the substrate 21 such that the dielectric layer 41 surrounds laterally the chip 11 and covers the power plane 27. The ground plane 39 is provided on both the back surface of the chip 11 (i.e., top surface in FIG. 1) and the top surface of the dielectric layer 41. The ground plane 39 is attached to the back surface of the chip 11 through an adhesive layer 33.

The adhesive layer 33 is electrically conductive, electrically coupling the ground plane 39 to the back surface of the chip 11 (which is used as a ground). The dielectric layer 41 may be fabricated from metal oxide having a high dielectric constant, such as tantalum oxide ($TaxOy$) or barium titanium oxide ($BaxTiOy$), or other suitable material well known in this art (e.g., glass-reinforced epoxy).

The dielectric layer 41 may be formed by stacking dielectric films, printing dielectric pastes, directly coating dielectric material, or using any other conventional technique. Depending on capacitance of the decoupling capacitor, the dielectric layer 41 may be constructed using a variety of materials and dimensions. The ground plane 39 may be a metal plate.

Electrically conductive, vertical connection bumps 37 are provided on the bump lands 25 and within the dielectric layer 41. The bump lands 25 are electrically coupled to the ground plane 39 through the bumps 37. Some of the bump lands 25 may be not coupled to circuit lines 23, but nevertheless may be coupled to the ground plane 39.

Solder balls 47 are formed on respective ball lands 29 of the substrate 21 and used as external connection terminals of the package 10. The bottom surface of the substrate 21 is covered with and protected by a solder resist layer 49. An encapsulant 45, made of epoxy resin, for example, is provided within and around the opening 22 of the substrate 21 so as to protect bonding wires 35.

As discussed above, the package 10 according to this embodiment is characterized by a decoupling capacitor composed of a power plane 27, a ground plane 39, and a dielectric layer 41. The power plane 27 is provided on the chip-attached surface of the substrate 21 and electrically coupled to a power net (for example, power circuit lines). Further, the ground plane 39 is provided on the back surface of the chip 11 and electrically coupled to a ground net (for example, ground circuit lines). In addition, the dielectric layer 41 is interposed between the power plane 27 and the ground plane 39. This structure provides a shorter path between power/ground terminals of the chip 11 and the decoupling capacitor, thereby reducing parasitic resistance/inductance of the decoupling capacitor. Moreover, the capacitance of the decoupling capacitor may be easily adjusted by varying the sizes of the power plane 27 and the ground plane 39 and/or the dielectric constant of the dielectric layer 41.

FIGS. 4A through 4D exemplarily illustrate, in cross-sectional views, a process of manufacturing the above-described package 10.

Figure 4A:
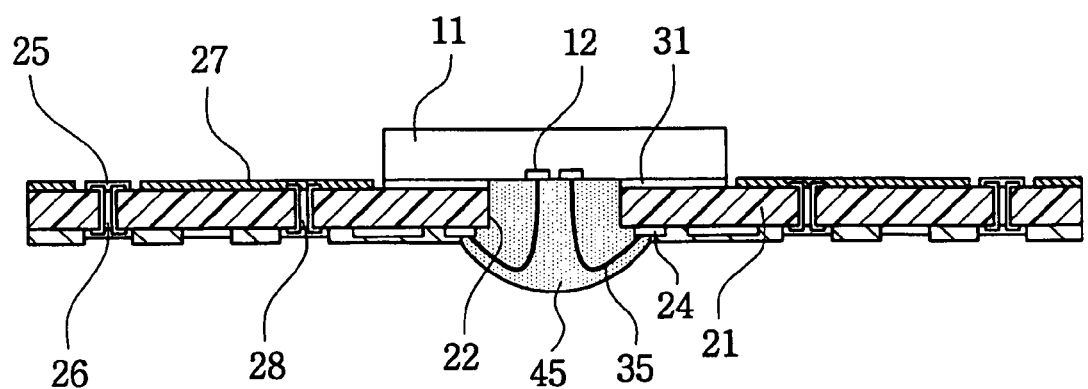
FIGS. 4A through 4D are cross-sectional views illustrating a process of manufacturing the semiconductor chip package of the first exemplary embodiment of the present invention.

Referring to FIG. 4A, the substrate 21 has the opening 22 in a central region thereof. The substrate 21 further has substrate pads 24, ball lands 29, and circuit lines 23 on the bottom surface thereof, and a power plane 27 and bump lands 25 on the top surface thereof. The bump lands 25 and the power plane 27 are electrically coupled to corresponding circuit lines 23 through internal vias 26 and 28 in the substrate 21, respectively.

The chip 11 is mechanically attached and electrically coupled to the substrate 21. The chip 11 faces the top surface of the substrate 21 such that the chip pads 12 are located within the opening 22, and then is attached to the top surface of the substrate 21 through an adhesive layer 31. Next, bonding wire 35 connects the chip pad 12 at one end and the substrate pad 24 at the other end, passing through the opening 22. After wire bonding, an encapsulant 45 is provided within and around the opening 22 of the substrate 21 so as to protect the bonding wires 35.

Figure 4B:
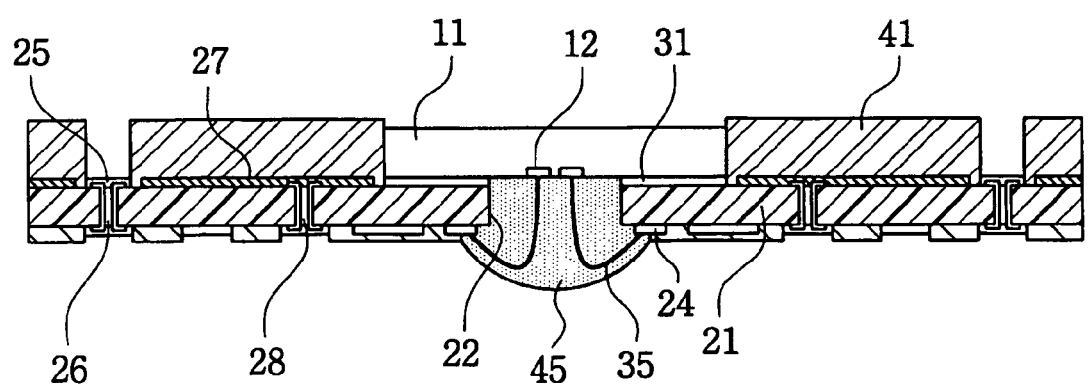

As shown in FIG. 4B, the dielectric layer 41 is provided on the top surface of the substrate 21 so as to surround laterally the chip 11. The dielectric layer 41 covers the power plane 27 and exposes the bump lands 25. The dielectric layer 41 is fabricated from dielectric material having a high dielectric constant, for example, higher than twenty, and may be formed by stacking dielectric films, printing dielectric pastes, directly coating dielectric material, or using any other conventional technique.

Figure 4C:
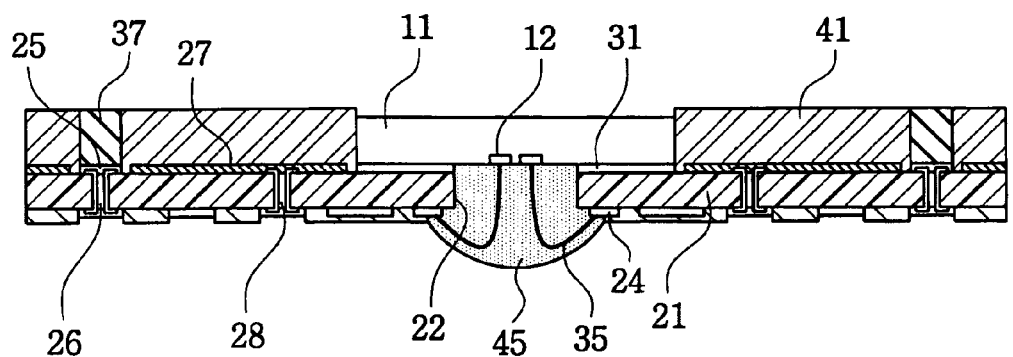

As shown in FIG. 4C, bumps 37 are provided on the bump lands 25 exposed through the dielectric layer 41. The bumps 37 are fabricated from electrically conductive material such as metal, and may be formed by using various conventional techniques.

Figure 4D:
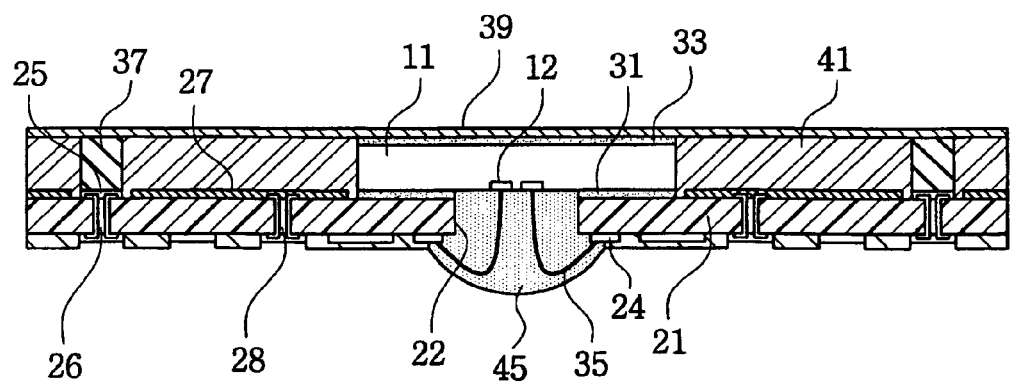

As shown in FIG. 4D, the ground plane 39 is provided on both the back surface of the chip 11 and the top surface of the dielectric layer 41. The ground plane 39 is attached to the back surface of the chip 11 through an adhesive layer 33. The adhesive layer 33 is electrically conductivity and coupled to the back surface of the chip 11, which can also be used as a ground.

Finally, as depicted in FIG. 3, solder balls 47, acting as external connection terminals of the package 10, are formed on the ball lands 29 of the substrate 21.

Second Exemplary Embodiment

Figure 5:
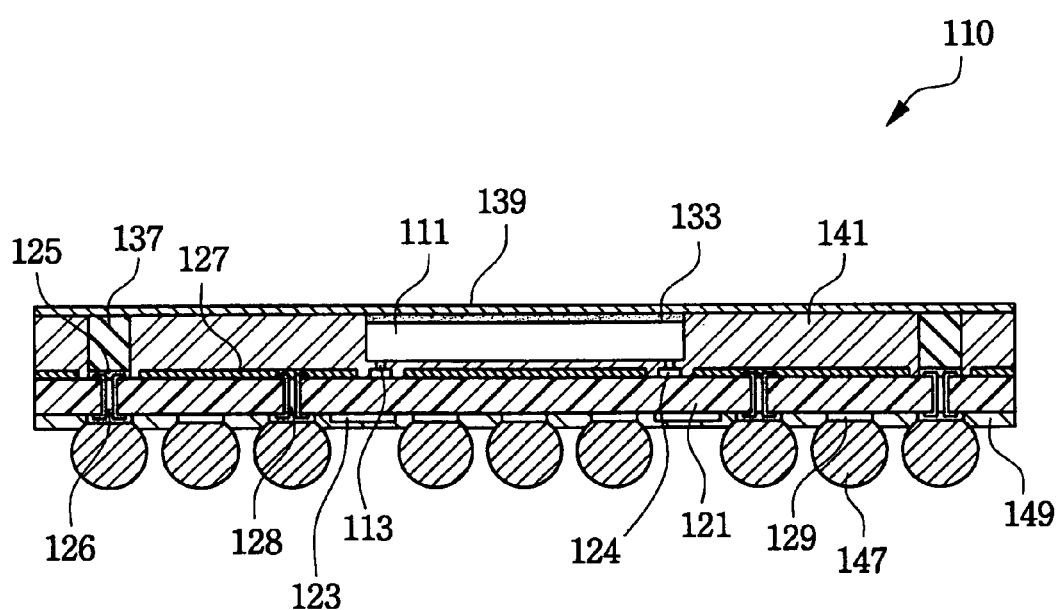
FIG. 5 is a cross-sectional view of a semiconductor chip package in accordance with a second exemplary embodiment of the present invention.

FIG. 5 shows, in a cross-sectional view, a semiconductor chip package 110 in accordance with a second exemplary embodiment of the present invention.

Referring to FIG. 5, a package 110 of this embodiment includes a semiconductor chip 111, which is attached to a substrate 121 in a flip-chip fashion through chip bumps 113. Solder balls 147 are formed under the substrate 121 and are used as external connection terminals of the package 110. The package 110 has a decoupling capacitor composed of a power plane 127, a ground plane 139, and a dielectric layer 141.

Instead of wire-bonding technique in the aforementioned embodiment, a flip-chip technique may be used to electrically connect the chip 11 and the substrate 121. Namely, the chip 111 and the substrate 121 are electrically connected through chip bumps 113 provided on chip pads (not shown). Chip bumps 113 are directly joined to substrate pads 124 disposed on the top surface of the substrate 121. Unlike the previous embodiment, then, an edge pad type chip may be used, and no opening need be provided in the substrate 121. In addition to substrate pads 124, the power plane 127 and the bump lands 125 are provided on the top surface of the substrate 121. Further, ball lands 129 and circuit lines 123 are provided on a bottom surface of the substrate 121.

The power plane 127 covers most of the top surface of the substrate 121. Substrate pads 124 and bump lands 125 are disposed like islands and separated from the power plane 127. Ball lands 129 preferably are arranged in a grid array and connected to circuit lines 123. Bump lands 125 and the power plane 127 are respectively coupled to circuit lines 123 through internal vias 126 and 128 in the substrate 121. Similarly, substrate pads 124 may be coupled to circuit lines 123 and/or ball lands 129 through internal vias (not shown) in the substrate 121.

Another, non-described elements in this embodiment are equal to or correspond to those in the previous embodiment.

FIGS. 6A through 6D exemplarily illustrate, in cross-sectional views, a process of the manufacturing package 110 of this embodiment.

Figure 6A:
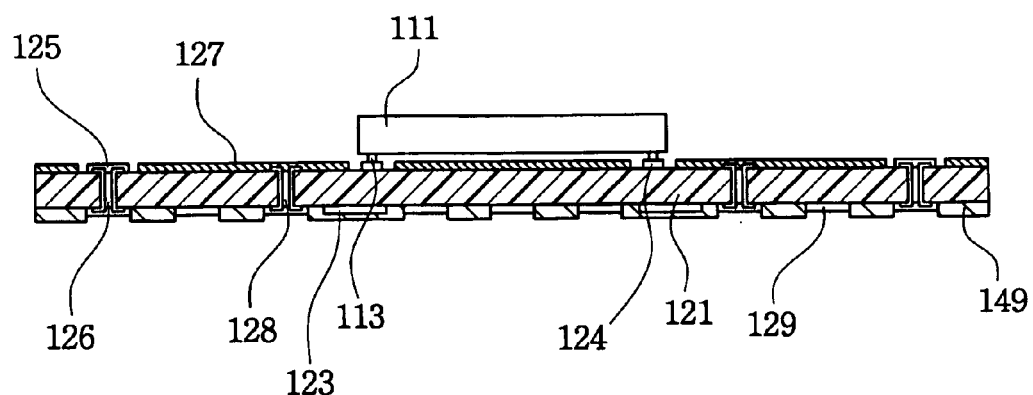
FIGS. 6A through 6D are cross-sectional views illustrating a process of manufacturing the semiconductor chip package of the second exemplary embodiment of the present invention.

Referring to FIG. 6A, the chip 111 is mechanically attached and electrically coupled to the substrate 121 in a flip-chip fashion using chip bumps 113. Chip bumps 113 are provided on chip pads (not shown) and joined to substrate pads 124 formed on the top surface of the substrate 121. The substrate 121 has substrate pads 124, the power plane 127, and bump lands 125 on the top surface thereof, and ball lands 129 and circuit lines 123 on the bottom surface thereof.

Figure 6B:
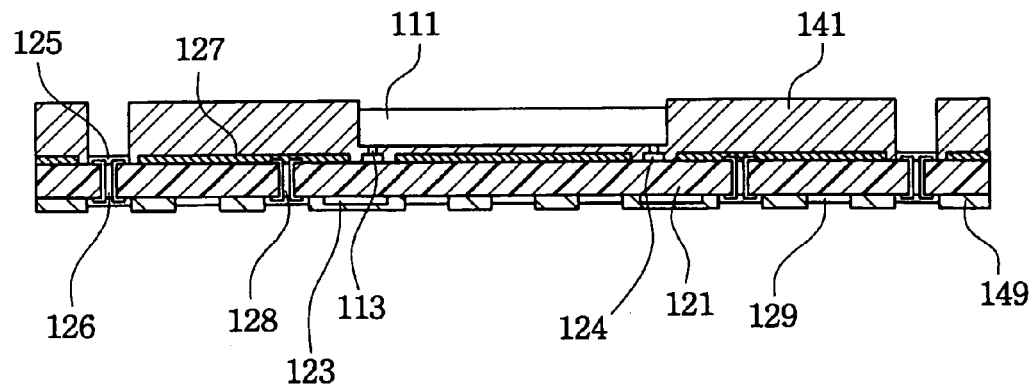

As shown in FIG. 6B, the dielectric layer 141 is provided on the top surface of the substrate 121 so as to surround laterally the chip 111 and also fill the gap between the chip 111 and the substrate 121. The dielectric layer 141 covers the power plane 127 and the substrate pads 124 and exposes bump lands 125.

Figure 6C:
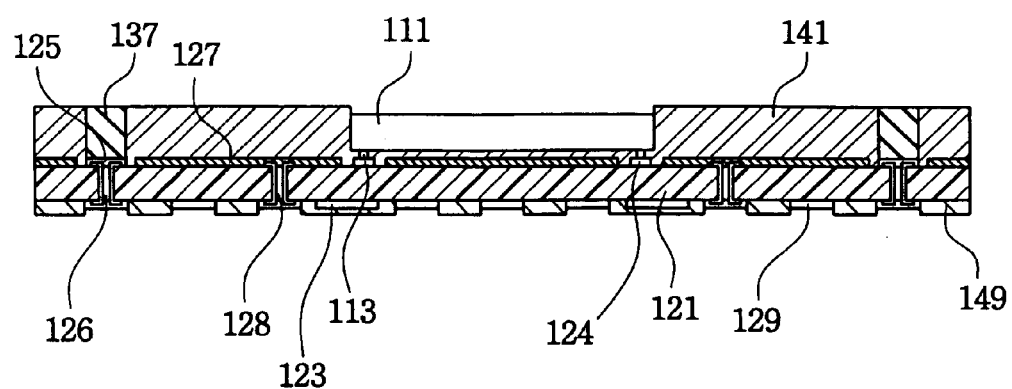
Figure 6D:
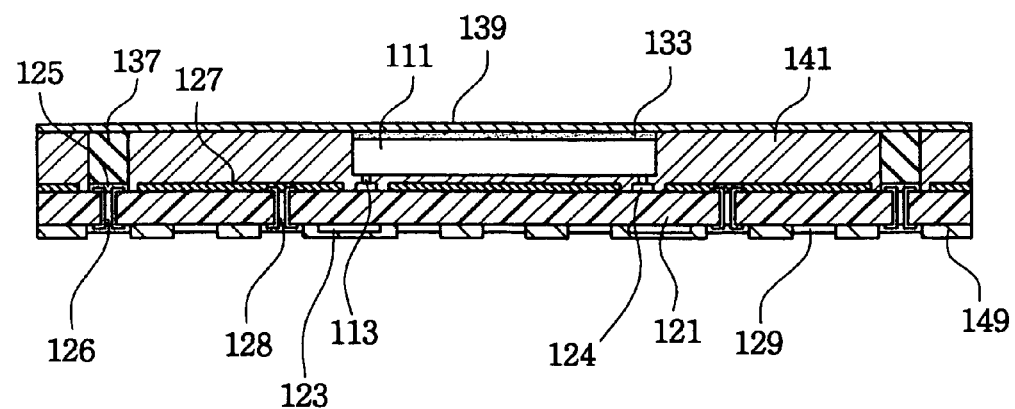

As shown in FIG. 6C, vertical connection bumps 137 are provided on the bump lands 125 exposed through the dielectric layer 141. Further, as shown in FIG. 6D, the ground plane 139 is provided on both the back surface of the chip 111 and the top surface of the dielectric layer 141. The ground plane 139 is attached to the back surface of the chip 111 through an adhesive layer 133. Finally, as shown in FIG. 5, solder balls 147 are formed on the ball lands 129 of the substrate 121.

Third Exemplary Embodiment

Figure 7:
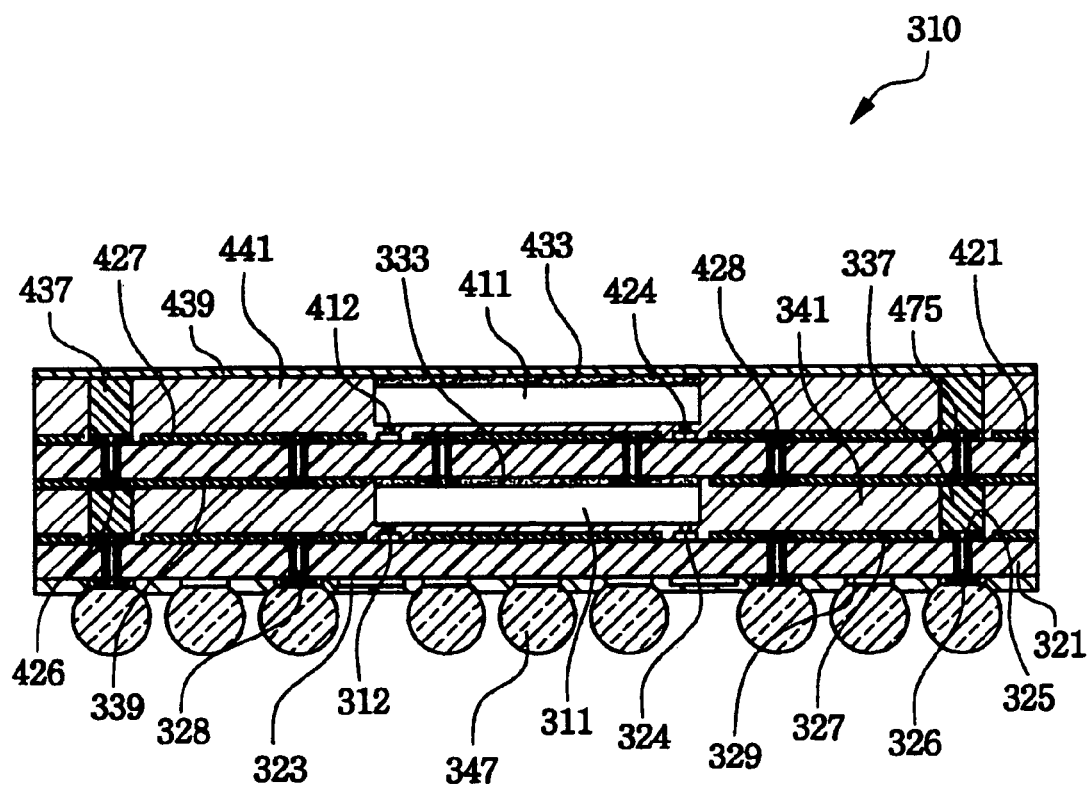
FIG. 7 is a cross-sectional view of a semiconductor chip package in accordance with a third exemplary embodiment of the present invention.
Figure 8:
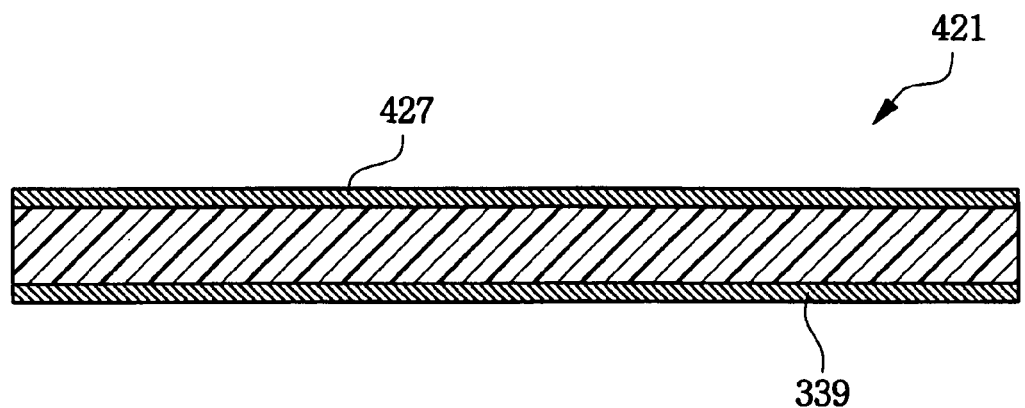
FIG. 8 is a cross-sectional view showing a substrate exemplarily used in the semiconductor chip package of the third exemplary embodiment of the present invention.
Figure 9A:
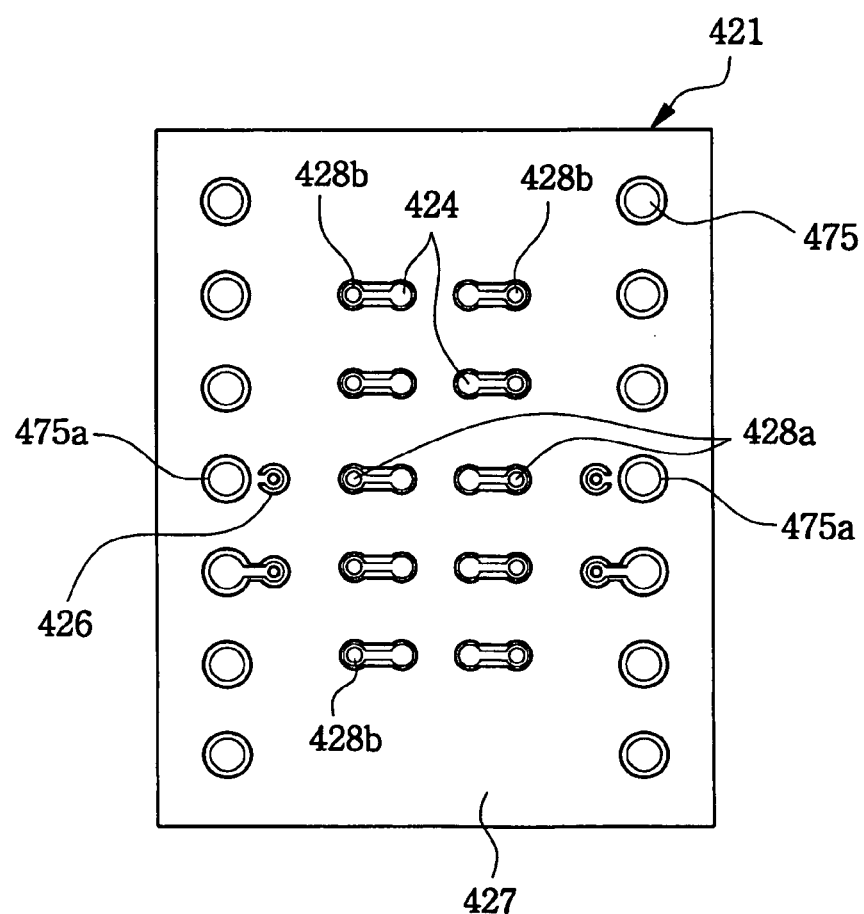
FIGS. 9A and 9B are plan views respectively showing top and bottom surfaces of the substrate shown in FIG. 8.
Figure 9B:
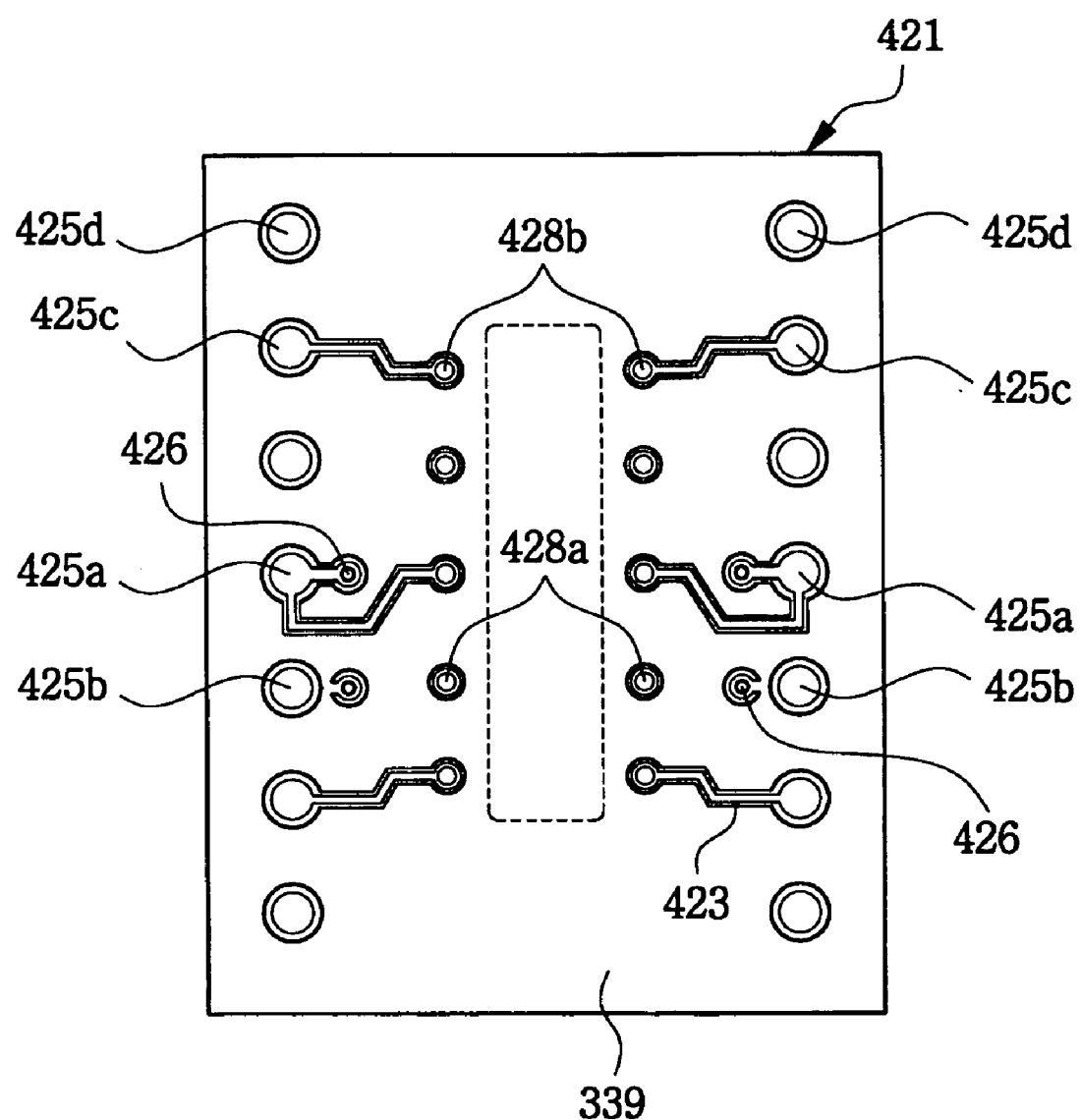

FIG. 7 shows, in a cross-sectional view, a semiconductor chip package 311 in accordance with a third exemplary embodiment of the present invention. Further, FIG. 8 shows, in a cross-sectional view, a substrate 421 exemplarily used in the package of this embodiment of the present invention, and FIGS. 9A and 9B show respectively, in plan views, top and bottom surfaces of the substrate 421 shown in FIG. 8.

Referring to FIG. 7, the package 311 of this embodiment includes two stacked semiconductor chips 311 and 411, which have chip bumps 312 and 412 and are attached to first and second substrates 321 and 421, respectively, in a flip-chip fashion through the chip bumps 312 and 412. Solder balls 347 are formed under the first substrate 321 and are used as external connection terminals of the package 310. The package 310 has two decoupling capacitors each composed of a power plane 327 and 427, a ground plane 339 and 439, and a dielectric layer 341 and 441.

The first chip 311 is attached to the first substrate 321 in a flip-chip fashion through the first chip bumps 312 provided on the first chip 311. The first chip bumps 312 are mechanically joined and electrically coupled to the substrate pads 324.

The first substrate 321 has, on a top surface thereof, first substrate pads 324, a first power plane 327 and first bump lands 325, and, on a bottom surface thereof, ball lands 329 and first circuit lines 323. The first power plane 327 covers most of the top surface of the first substrate 321. The first substrate pads 324 and the first bump lands 325 are disposed like islands and separated from the first power plane 327. In alternative embodiment, some of the first bump lands 325 may be coupled to the first power plane 327. The ball lands 329 are arranged in a grid array and coupled to the first circuit lines 323.

The first substrate pads 324, the first bump lands 325, and the first power plane 327 are selectively coupled to the first circuit lines 323 and/or the ball lands 329 through internal vias 326 and 328 in the first substrate 321. Those skilled in this art will appreciate that the above conductive patterns of the first substrate 321 may have a variety of shapes, configurations, and electric networks. Further, the first substrate 321 may employ various multi-layered wiring boards well known in this art.

The first dielectric layer 341 is provided on the top surface of the lower substrate 321 so as to surround laterally the first chip 311 and also fill a gap between the first chip 311 and the first substrate 321. The first dielectric layer 341 covers the first power plane 327 and the first substrate pads 324. First vertical connection bumps 337 are provided within the first dielectric layer 341 and on the first bump lands 325 of the first substrate 321.

A second substrate 421 is attached to the back surface of the first chip 311 through a conductive adhesive layer 333. As also shown in FIG. 8, the second substrate 421 has the second power plane 427 on a top surface thereof and a first ground plane 339 on a bottom surface thereof.

As exemplarily shown in FIG. 9B, the first ground plane 339 covers most of the bottom surface of the second substrate 421. Further, the second bump lands 425 are disposed like islands on the bottom surface of the second substrate 421 and separated from the first ground plane 339. Each of the second bump lands 425 may be used for signal, power, or ground. Therefore, some of the second bump lands 425 that act as ground lands may be coupled to the first ground plane 339. Further, the second circuit lines 423 are provided on the bottom surface of the second substrate 421. The first ground plane 339, the second bump lands 425, and the second circuit lines 423 are selectively coupled to internal vias 426 and 428. It will be appreciated that electric networks shown in FIG. 9B are exemplary only, and not as a limitation of the invention.

In addition, as exemplarily shown in FIG. 9A, a second power plane 427 covers most of the top surface of the second substrate 421. Further, third bump lands 475 are disposed like islands on the top surface of the second substrate 421 and separated from the second power plane 427. Each of the third bump lands 475 may be used for signal, power, or ground. Therefore, some of the third bump lands 475 that act as power lands may be coupled to the second power plane 427. Further, the second substrate pads 424 are provided on the top surface of the second substrate 421. The second power plane 427, the third bump lands 475, and the second substrate pads 424 are selectively coupled to internal vias 426 and 428. It will be appreciated that electric networks shown in FIG. 9A are exemplary only, and not as a limitation of the invention.

Returning to FIG. 7, the second chip 411 is attached to the second substrate 421 in a flip-chip fashion through the second chip bumps 412 provided on the second chip 411. The second chip bumps 412 are mechanically joined and electrically coupled to the second substrate pads 424. The second dielectric layer 441 is provided on the top surface of the second substrate 421 so as to surround laterally the second chip 411 and also fill a gap between the second chip 411 and the second substrate 421. The second dielectric layer 441 covers the second power plane 427 and the second substrate pads 424. The second vertical connection bumps 437 are provided within the second dielectric layer 441 and on the third bump lands 475 of the second substrate 421.

The second ground plane 439 is provided on both the back surface of the second chip 411 and the top surface of the second dielectric layer 441. The second ground plane 439 is attached to the back surface of the second chip 411 through a conductive adhesive layer 433. The second ground plane 439 is coupled to the second vertical connection bumps 437.

FIGS. 10A through 10E exemplarily show, in cross-sectional views, a process of manufacturing the package 310 of this embodiment.

Figure 10A:
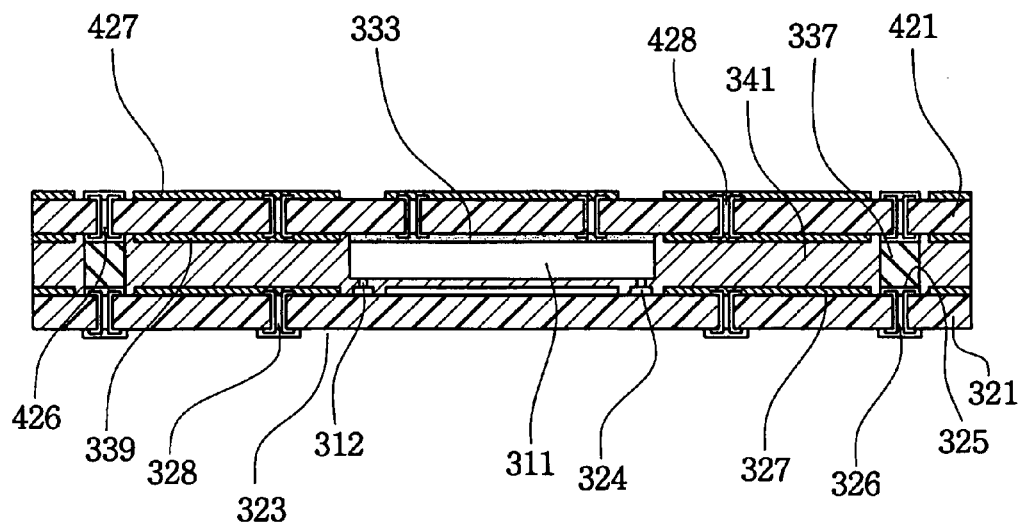
FIGS. 10A through 10E are cross-sectional views illustrating a process of manufacturing the semiconductor chip package of the third exemplary embodiment of the present invention.

Referring to FIG. 10A, the first chip 311 is mechanically attached and electrically coupled to the first substrate 321 in a flip-chip fashion using the first chip bumps 312. The first chip bumps 312 are provided on chip pads (not shown) and joined to the first substrate pads 324 formed on the top surface of the first substrate 321. The first dielectric layer 341 is provided on the top surface of the first substrate 321 so as to surround laterally the first chip 311 and also fill a gap between the first chip 311 and the first substrate 321. The first dielectric layer 341 covers the first power plane 327 and the first substrate pads 324 and exposes the first bump lands 325. The first vertical connection bumps 337 are provided on the first bump lands 325 exposed through the first dielectric layer 341.

Further, the second substrate 421 is attached to the back surface of the first chip 311 through a conductive adhesive layer 333. Therefore, the first connection bumps 337 of the first substrate 321 are respectively coupled to the second bump lands 425 of the second substrate 421 by their functions (for example, ground, power or signal).

Figure 10B:
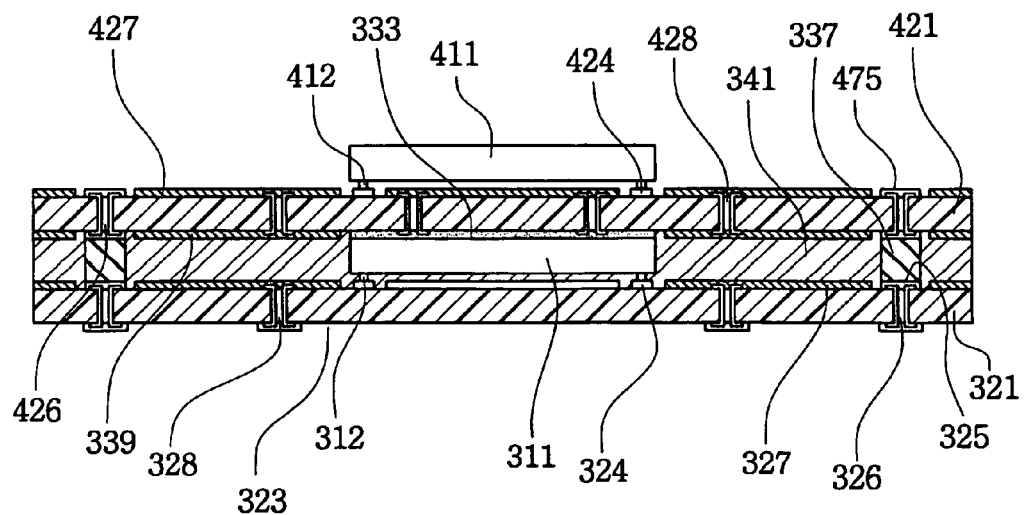
Figure 10C:
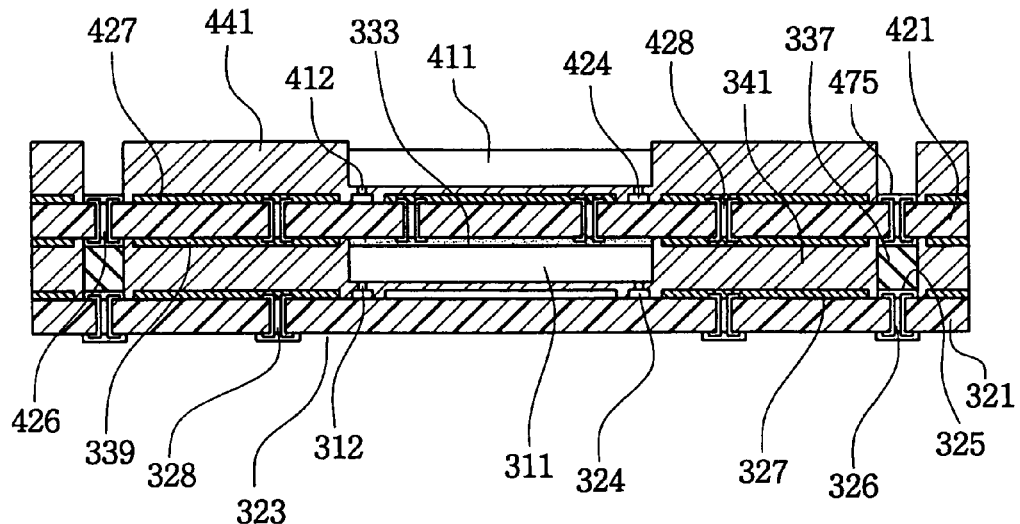

Referring to FIG. 10B, the second chip 411 is then attached and coupled to the second substrate 421 in a flip-chip fashion using the second chip bumps 412. Referring to FIG. 10C, the second dielectric layer 441 is provided on the top surface of the second substrate 421 so as to surround laterally the second chip 411 and also fill a gap between the second chip 411 and the second substrate 421. The second dielectric layer 441 covers the second power plane 427 and the second substrate pads 424 and exposes the third bump lands 475.

Figure 10D:
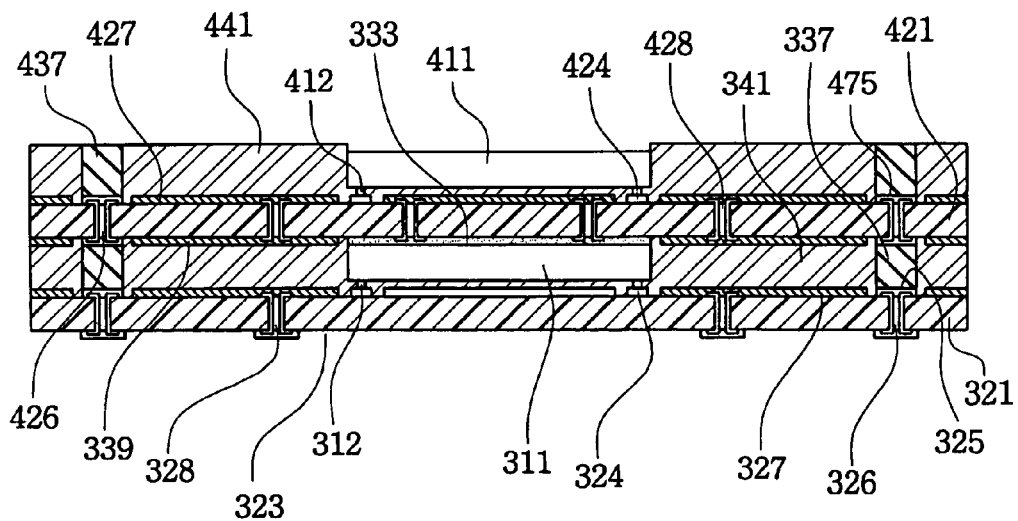
Figure 10E:
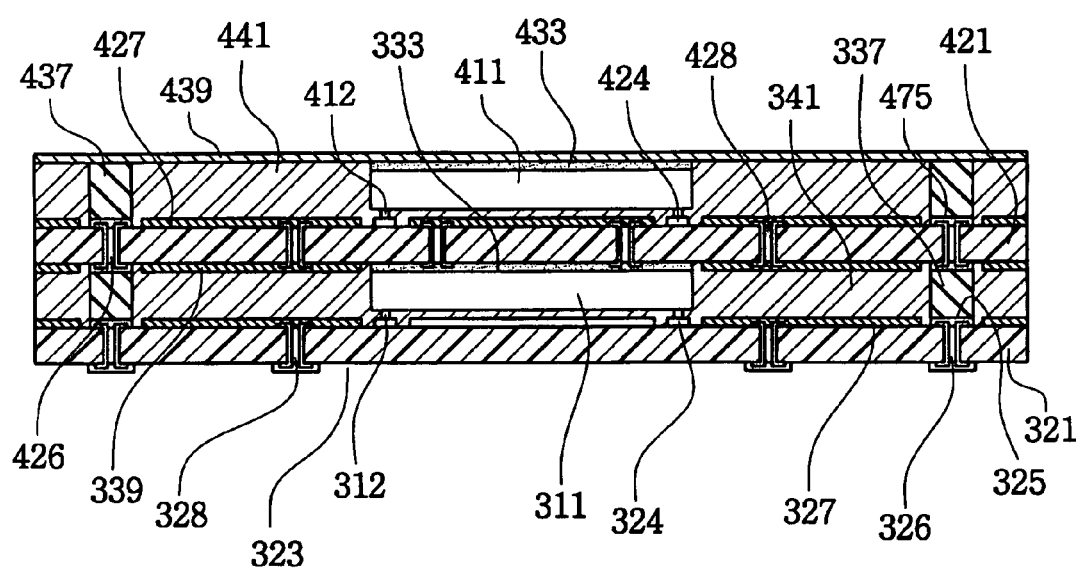

As shown in FIG. 10D, the second vertical connection bumps 437 are provided on the third bump lands 425 exposed through the second dielectric layer 441. Next, as shown in FIG. 10E, the second ground plane 439 is provided on both the back surface of the second chip 411 and the top surface of the second dielectric layer 441. The second ground plane 439 is attached to the back surface of the second chip 411 through an adhesive layer 433. Finally, as shown in FIG. 7, solder balls 347 are formed on the ball lands 329 of the first substrate 321.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor chip package, comprising:
 a substrate including:
  a first surface,
  a second surface,
  circuit lines provided on at least one of the first and second surfaces,
  a power plane provided on the second surface,
  at least one bump land provided on the second surface and coupled to the circuit lines, and
  a plurality of ball lands provided on the first surface;
 a semiconductor chip attached to the second surface of the substrate and electrically coupled to the circuit lines;
 a dielectric layer disposed on the second surface of the substrate, said dielectric layer disposed to surround laterally the chip, cover the power plane, and expose the bump land;
 a ground plane disposed on the chip and the dielectric layer;
 a vertical connection bump disposed within the dielectric layer and on the bump land, said vertical connection bump electrically coupled to the ground plane; and
 a plurality of solder balls disposed on the plurality of ball lands.

2. The package of claim 1 wherein the semiconductor chip includes a plurality of chip pads provided on an active surface thereof, and wherein the substrate further includes a plurality of substrate pads provided on the first surface thereof and connected to the circuit lines.

3. The package of claim 2 wherein the substrate further includes an opening to which the plurality of chip pads are exposed.

4. The package of claim 3 further comprising:
a plurality of bonding wires electrically connecting the chip pads and the substrate pads through the opening.

5. The package of claim 1 wherein the semiconductor chip includes a plurality of chip pads disposed on an active surface thereof, and wherein the substrate further includes a plurality of substrate pads disposed on the second surface thereof and connected to the circuit lines.

6. The package of claim 5, further comprising:
a plurality of chip bumps disposed on the chip pads and joined to the substrate pads.

7. The package of claim 1 wherein the power plane is electrically coupled to the circuit lines through first internal vias in the substrate.

8. The package of claim 1 wherein the bump land is electrically coupled to the circuit lines through second internal vias in the substrate.

9. The package of claim 1 wherein the ground plane is attached to the chip through an adhesive layer having electrical conductivity.

10. A method for manufacturing a semiconductor chip package, comprising:
providing a substrate including:
a first surface,
a second surface,
circuit lines provided on at least one of the first and second surfaces,
a power plane provided on the second surface,
at least one bump land provided on the second surface and coupled to the circuit lines, and
a plurality of ball lands provided on the first surface;
attaching a semiconductor chip to the second surface to electrically couple said semiconductor chip to the circuit lines;
disposing a dielectric layer on the second surface of the substrate so as to surround laterally the chip, to cover the power plane, and to expose the bump land;
disposing at least one vertical connection bump within the dielectric layer and on the bump land;
disposing a ground plane on the chip and the dielectric layer such that the ground plane is electrically coupled to the vertical connection bump; and
disposing a plurality of solder balls on the ball lands.

11. The method of claim 10 wherein:
providing a substrate comprises providing a substrate further including:
a plurality of substrate pads provided on the first surface thereof and connected to the circuit lines, and
an opening to which the chip pads are exposed; and
attaching a semiconductor chip comprises attaching a semiconductor chip having a plurality of chip pads provided on an active surface thereof.

12. The method of claim 11 wherein attaching a semiconductor chip to the second surface to electrically couple said semiconductor chip to the circuit lines comprises connecting a bonding wire to one of the plurality of chip pads and to one of the plurality of substrate pads through the opening.

13. The method of claim 10 wherein:
providing a substrate comprises providing a substrate further including a plurality of substrate pads provided on the second surface thereof and connected to the circuit lines; and
attaching a semiconductor chip comprises attaching a semiconductor chip having a plurality of chip pads provided on an active surface thereof.

14. The method of claim 13 wherein attaching a semiconductor chip to the second surface to electrically couple said semiconductor chip to the circuit lines comprises connecting a c.hip bump disposed on the chip pad to one of the plurality of substrate pad.

15. The method of claim 10 wherein providing of the dielectric layer includes stacking dielectric films, printing dielectric pastes, or directly coating dielectric material.

16. A semiconductor chip package, comprising:
a first substrate, including:
a first bottom surface,
a first top surface,
first circuit lines disposed on at least one of the first bottom surface and the first top surface,
a first power plane disposed on the first top surface,
a first bump land disposed on the first top surface and coupled to the first circuit lines, and
a plurality of ball lands disposed on the first bottom surface;
a first semiconductor chip attached to the first top surface and electrically coupled to the first circuit lines;
a first dielectric layer disposed on the first top surface, said first dielectric layer surrounding laterally the first chip, covering the first power plane, and exposing the first bump land;
a second substrate including:
a second bottom surface,
a second top surface,
second circuit lines disposed on at least one of the second bottom and top surfaces,
a first ground plane disposed on the second bottom surface,
a second bump land disposed on the second bottom surface,
a second power plane disposed on the second top surface, and
a third bump land disposed on the second top surface;
wherein the second substrate is mechanically coupled to the first chip and the first dielectric layer of the first substrate;
a first vertical connection bump disposed within the first dielectric layer and on the first bump land, said first vertical connection bump electrically coupled to the first ground plane;
a second semiconductor chip attached to the second top surface of the second substrate and electrically coupled to the second circuit lines;
a second dielectric layer disposed on the second top surface of the second substrate, the
second dielectric layer surrounding laterally the second chip, covering the second power plane, and exposing the third bumn land
a second ground plane disposed on the second chip and the second dielectric layer;
a second vertical connection bump disposed within the second dielectric la cr and on the third bump land, said second vertical connection bump electrically coupled to the second ground plane; and a plurality of solder balls disposed on the plurality of ball lands of the first substrate.

17. In a semiconductor chip package including a substrate having a power plane and at least one bump land provided on a first surface of said substrate, the bump land coupled to circuit lines on the substrate; and a semiconductor chip attached to the first surface of the substrate and electrically coupled to the circuit lines, a decouplingcapacitor comprising:
- a dielectric layer disposed on the first surface of the substrate, said dielectric layer structured to surround laterally the chip, cover the power plane, and expose the bump land;
- a ground plane disposed on the chip and the dielectric layer; and
- a vertical connection bump disposed within the dielectric layer and on the bump land, said vertical connection bump electrically coupled to the ground plane.

18. The package of claim 17 wherein the power plane is electrically coupled to the circuit lines through first internal vias in the substrate.

19. The package of claim 17 wherein the bump land is electrically coupled to the circuit lines through second internal vias in the substrate.

20. The package of claim 17 wherein the ground plane is attached to the chip through an adhesive layer having electrical conductivity.

* * * * *

UNITED STATES PATENT AND TRADEMARK OFFICE
CERTIFICATE OF CORRECTION

PATENT NO.          : 7,129,571 B2
APPLICATION NO. : 10/977533
DATED                 : October 31, 2006
INVENTOR(S)        : Sun-Won Kang It is certified that error appears in the above-identified patent and that said Letters Patent is hereby corrected as shown below:

Column 5, line 39, the words "chip 11" should read -- chip 111 --;
Column 10, line 12, the word "c.hip" should read -- chip --;
Column 10, line 61, the word "bumn" should read -- bump --;
Column 10, line 65, the words "la cr" should read -- layer --;
Column 11, line 8, the word "decouplingcapacitor" should read -- decoupling capacitor --.

Signed and Sealed this

Twelfth Day of August, 2008

JON W. DUDAS
*Director of the United States Patent and Trademark Office*